United States Patent
Wu et al.

(10) Patent No.: US 10,477,691 B2
(45) Date of Patent: Nov. 12, 2019

(54) FLEXIBLE DISPLAY DEVICE AND MANUFACTURING METHOD THEREOF

(71) Applicant: E Ink Holdings Inc., Hsinchu (TW)

(72) Inventors: Chi-Ming Wu, Hsinchu (TW); Chih-Hua Cheng, Hsinchu (TW); Tsung-Chin Lin, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 16/145,194

(22) Filed: Sep. 28, 2018

(65) Prior Publication Data

US 2019/0181194 A1 Jun. 13, 2019

(30) Foreign Application Priority Data

Dec. 13, 2017 (TW) .............. 106143780 A
Feb. 13, 2018 (TW) .............. 107105344 A

(51) Int. Cl.
| | | |
|---|---|---|
| *H01L 27/15* | (2006.01) | |
| *H05K 1/18* | (2006.01) | |
| *G06F 1/16* | (2006.01) | |
| *H05K 3/28* | (2006.01) | |
| *H01L 27/32* | (2006.01) | |

(Continued)

(52) U.S. Cl.
CPC ........... *H05K 1/189* (2013.01); *G06F 1/1652* (2013.01); *H01L 27/3244* (2013.01); *H01L 51/0097* (2013.01); *H01L 51/5253* (2013.01); *H01L 51/56* (2013.01); *H05K 3/28* (2013.01); *H05K 2201/10128* (2013.01)

(58) Field of Classification Search
CPC .............. H05K 1/189; H01L 27/32244; H01L 51/5253; H01L 51/0097; G06F 1/1652
See application file for complete search history.

(56) References Cited

U.S. PATENT DOCUMENTS

| 8,492,969 B2 | 7/2013 | Lee et al. |
| 8,982,575 B2 | 3/2015 | Lai et al. |
| 2016/0313478 A1* | 10/2016 | Lee .................. G02B 5/0242 |

FOREIGN PATENT DOCUMENTS

| CN | 103022378 A | 4/2013 |
| CN | 102610607 B | 7/2014 |

(Continued)

OTHER PUBLICATIONS

Corresponding Taiwan office action dated Nov. 8, 2018.
Corresponding Taiwan office action dated Aug. 10, 2018.

*Primary Examiner* — Hsien Ming Lee
(74) *Attorney, Agent, or Firm* — CKC & Partners Co., LLC

(57) ABSTRACT

A flexible display device includes a TFT array substrate, a flexible printed circuit board, a front panel laminate, a first protection sheet having a through hole, and waterproof glue. The flexible printed circuit board is disposed on an edge of a first surface of the TFT array substrate, and extends outward from the edge of the first surface. The front panel laminate is located on the first surface of the TFT array substrate. The first protection sheet covers the front panel laminate, the first surface of the TFT array substrate, and the flexible printed circuit board. A portion of the flexible printed circuit board and a portion of the TFT array substrate are located in the through hole. The waterproof glue is located in the through hole and covers the portion of the flexible printed circuit board and the portion of the TFT array substrate.

20 Claims, 7 Drawing Sheets

(51) Int. Cl.
*H01L 51/00* (2006.01)
*H01L 51/52* (2006.01)
*H01L 51/56* (2006.01)

(56) References Cited

FOREIGN PATENT DOCUMENTS

| | | |
|---|---|---|
| CN | 103913920 A | 7/2014 |
| CN | 102543899 B | 4/2016 |
| CN | 103199199 B | 6/2016 |
| TW | I457875 B | 10/2014 |
| TW | I484276 B | 5/2015 |

\* cited by examiner

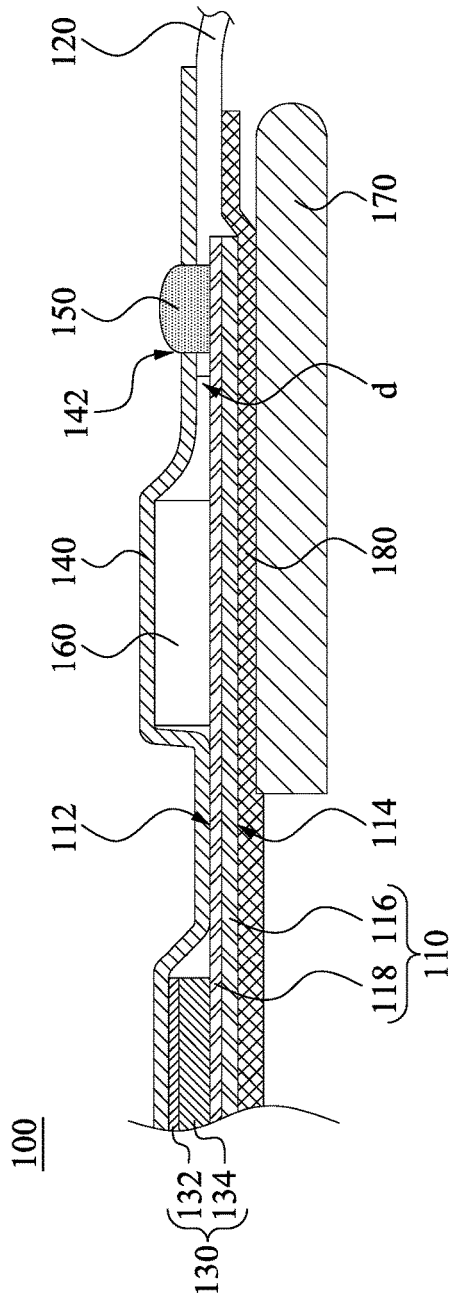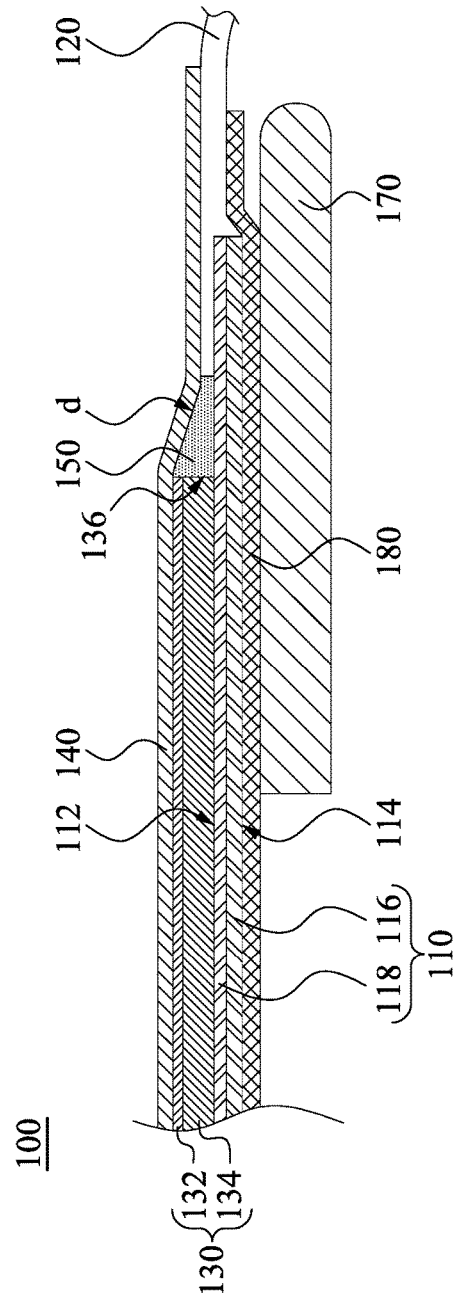

FLEXIBLE DISPLAY DEVICE AND MANUFACTURING METHOD THEREOF

RELATED APPLICATIONS

This application claims priority to Taiwan Application Serial Number 106143780, filed Dec. 13, 2017, and Taiwan Application Serial Number 107105344, filed Feb. 13, 2018, which are herein incorporated by reference.

BACKGROUND

Field of Invention

The present invention relates to a flexible display device and a manufacturing method of the flexible display device.

Description of Related Art

In the market for various types of consumer electronic products, flexible display devices have been widely used as display screens for electronic products, such as e-books. In general, a flexible display device has a front panel laminate (FPL), a thin-film transistor (TFT) array substrate, and a flexible printed circuit board (FPC). The front panel laminate is located on the TFT array substrate and serves as a display area of the display device. The flexible printed circuit board and an integrated circuit may be disposed on an edge of the TFT array substrate (e.g., a non-display area of the display device). Moreover, two hot melt protective sheets (HMPS) may be respectively attached to a top side and a bottom side of the display device to prevent moisture from entering.

However, a height difference may be formed between a surface of the TFT array substrate and each of the front panel laminate, the flexible printed circuit board, and the integrated circuit. Therefore, the hot melt protective sheet cannot effectively seal the front panel laminate, and gaps may be formed easily. As a result, moisture may easily enter the front panel laminate through a gap between the HMPS adjacent to the flexible printed circuit board and the TFT array substrate, which may cause the display device to have a non-uniform brightness (Mura).

SUMMARY

An aspect of the present invention is to provide a flexible display device.

According to an embodiment of the present invention, a flexible display device includes a thin-film transistor (TFT) array substrate, a flexible printed circuit board, a front panel laminate, a first protection sheet, and a waterproof glue. The TFT array substrate has a first surface. The flexible printed circuit board is disposed on an edge of the first surface, and extends outward from the edge of the first surface. The front panel laminate is located on the first surface of the TFT array substrate. The first protection sheet covers the front panel laminate, the first surface of the TFT array substrate, and the flexible printed circuit board on the first surface, and has a through hole. A portion of the flexible printed circuit board and a portion of the TFT array substrate are located in the through hole. The waterproof glue is located in the through hole and covers the portion of the flexible printed circuit board and the portion of the TFT array substrate.

In one embodiment of the present invention, the waterproof glue abuts the first surface of the TFT array substrate, the flexible printed circuit board, and the first protection sheet.

In one embodiment of the present invention, a gap is among a lateral surface of the front panel laminate, the first protection sheet, the TFT array substrate, and the flexible printed circuit board, and is in communication with the through hole, and the waterproof glue extends to the gap.

In one embodiment of the present invention, the waterproof glue abuts the lateral surface of the front panel laminate.

In one embodiment of the present invention, the waterproof glue protrudes from through hole of the first protection sheet.

In one embodiment of the present invention, the flexible display device further includes an integrated circuit. The integrated circuit is located on the first surface of the TFT array substrate, and is located between the front panel laminate and the flexible printed circuit board.

In one embodiment of the present invention, the flexible display device further includes a supporting plate. The TFT array substrate is located on the supporting plate.

In one embodiment of the present invention, the TFT array substrate has a second surface opposite the first surface, and the flexible display device further includes a second protection sheet. The second protection sheet covers the second surface of the TFT array substrate.

In one embodiment of the present invention, the second protection sheet is a hot melt protective sheet (HMPS).

In one embodiment of the present invention, the first protection sheet is a hot melt protective sheet.

In one embodiment of the present invention, the TFT array substrate includes a flexible substrate and a thin-film transistor (TFT) layer. The TFT layer is located on the flexible substrate.

In one embodiment of the present invention, the front panel laminate is an electro-phoretic display panel or an organic light-emitting diode (OLED) panel.

In one embodiment of the present invention, the front panel laminate includes a light-transmissive film and a display medium layer. The display medium layer is located between the light-transmissive film and the TFT array substrate.

An aspect of the present invention is to provide a flexible display device.

According to an embodiment of the present invention, a flexible display device includes a thin-film transistor (TFT) array substrate, an integrated circuit, a front panel laminate, a first protection sheet, and a waterproof glue. The TFT array substrate has a first surface. The integrated circuit is located on the first surface of the TFT array substrate. The front panel laminate is located on the first surface of the TFT array substrate. The first protection sheet covers the front panel laminate and the first surface of the TFT array substrate, and has an opening, and the integrated circuit is in the opening. The waterproof glue is located in the opening and surrounds the integrated circuit.

In one embodiment of the present invention, the waterproof glue extends over a portion of the first protection sheet.

In one embodiment of the present invention, the first protection sheet is a hot melt protective sheet (HMPS).

In one embodiment of the present invention, the TFT array substrate has a second surface opposite the first surface, and the flexible display device further includes a second protection sheet. The second protection sheet covers the second surface of the TFT array substrate.

An aspect of the present invention is to provide a manufacturing method of a flexible display device.

According to an embodiment of the present invention, a manufacturing method of a flexible display device includes forming a through hole in a first protection sheet, adhering the first protection sheet to a first surface of a thin-film transistor (TFT) array substrate on which a front panel laminate and a flexible printed circuit board are disposed, in which a portion of the flexible printed circuit board and a portion of the TFT array substrate are located in the through hole, and filling a waterproof glue in the through hole to cover the portion of the flexible printed circuit board and the portion of the TFT array substrate.

In one embodiment of the present invention, the filling of the waterproof glue includes extending the waterproof glue to a gap in communication with the through hole through capillary action, in which the gap is among a lateral surface of the front panel laminate, the first protection sheet, the TFT array substrate, and the flexible printed circuit board.

In one embodiment of the present invention, the manufacturing method of the flexible display device further includes adhering a second protection sheet to a second surface of the TFT array substrate, in which the second surface is opposite the first surface.

In the aforementioned embodiments of the present invention, because the first protection sheet has the through hole, and a portion of the flexible printed circuit board and a portion of the TFT array substrate are located in the through hole, the waterproof glue may fill in the through hole of the first protection sheet such that the waterproof glue covers the flexible printed circuit board and the TFT array substrate that are in the through hole. As a result, the waterproof glue can fill in a gap below the first protection sheet, in which the gap is formed by a height difference between the flexible printed circuit board and the TFT array substrate, such that a beginning of entering the flexible display device for moisture can be closed. Therefore, moisture does not easily affect the front panel laminate to cause non-uniform brightness (Mura) in the flexible display device, thereby improving the display quality of the flexible display device.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows:

FIG. 2 is a cross-sectional view of the flexible display device taken along line 2-2 shown in FIG. 1;

FIG. 3 is a cross-sectional view of the flexible display device taken along line 3-3 shown in FIG. 1;

DETAILED DESCRIPTION

Figure 1:
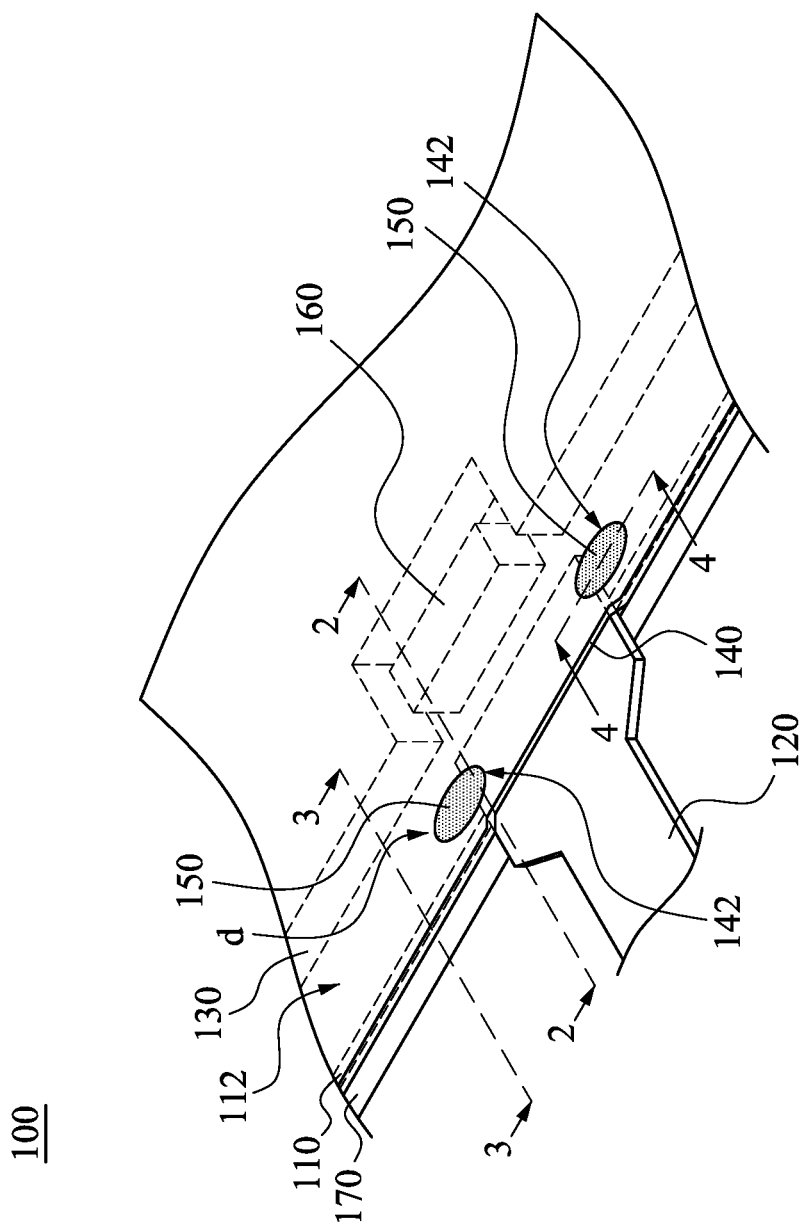
FIG. 1 is a partially perspective view of a flexible display device according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a partially perspective view of a flexible display device 100 according to one embodiment of the present invention. FIG. 2 is a cross-sectional view of the flexible display device 100 taken along line 2-2 shown in FIG. 1. As shown in FIG. 1 and FIG. 2, the flexible display device 100 includes a thin-film transistor (TFT) array substrate 110, a flexible printed circuit board 120, a front panel laminate 130, a first protection sheet 140, and a waterproof glue 150. The TFT array substrate 110 has a first surface 112 and a second surface 114 opposite the first surface 112. The flexible printed circuit board 120 is disposed on an edge of the first surface 112 of the TFT array substrate 110, and extends outward from the edge of the first surface 112 of the TFT array substrate 110. The front panel laminate 130 is located on the first surface 112 of the TFT array substrate 110. The first protection sheet 140 is an upmost layer of FIG. 1, which covers the front panel laminate 130, the first surface 112 of the TFT array substrate 110, and the flexible printed circuit board 120 that is on the first surface 112. In this embodiment, the front panel laminate 130 may be an electrophoretic display panel or an organic light-emitting diode (OLED) panel.

Furthermore, the first protection sheet 140 has a through hole 142. In this embodiment, the shape of the through hole 142 is an ellipse, but the present invention is not limited in this regard. A portion of the flexible printed circuit board 120 and a portion of the TFT array substrate 110 are located in the through hole 142. Since the flexible printed circuit board 120 has a thickness, a height difference is formed by an edge of the flexible printed circuit board 120 and the first surface 112 of the TFT array substrate 110, and the through hole 142 of the first protection sheet 140 corresponds to the height difference in position. The waterproof glue 150 is located in the through hole 142 of the first protection sheet 140, and covers the flexible printed circuit board 120 and the TFT array substrate 110 that are in the through hole 142.

According to the configuration of the aforementioned flexible display device 100, because the first protection sheet 140 has the through hole 142 and a portion of the flexible printed circuit board 120 and a portion of the TFT array substrate 110 are located in the through hole 142, the waterproof glue 150 may fill in by the through hole 142 of the first protection sheet 140 such that the waterproof glue 150 covers the flexible printed circuit board 120 and the TFT array substrate 110 that are in the through hole 142. As a result, the waterproof glue 150 can fill in a gap d below the first protection sheet 140, in which the gap d is formed by the height difference between the flexible printed circuit board 120 and the TFT array substrate 110, such that a beginning of entering the flexible display device 100 for moisture can be closed. Therefore, moisture does not easily affect the front panel laminate 130 to cause non-uniform brightness (Mura) in the flexible display device 100, thereby improving the display quality of the flexible display device 100.

In this embodiment, the waterproof glue 150 protrudes from the through hole 142 of the first protection sheet 140, and the waterproof glue 150 abuts the first surface 112 of the TFT array substrate 110, the flexible printed circuit board 120, and the first protection sheet 140, thereby ensuring that the gap d below the first protection sheet 140 is insulated by the waterproof glue 150 and cannot be in communication with the outside of the flexible display device 100 through the through hole 142.

The flexible display device 100 further includes an integrated circuit 160. The integrated circuit 160 is located on the first surface 112 of the TFT array substrate 110, and is located between the front panel laminate 130 and the flexible printed circuit board 120. A height difference is formed between an edge of the integrated circuit 160 and the first surface 112 of the TFT array substrate 110, and thus the gap d below the first protection sheet 140 may extend from the flexible printed circuit board 120 to the integrated circuit 160. Since the through hole 142 of the first protection sheet 140 is in communication with the gap d, the through hole 142 can be filled with the waterproof glue 150 and the waterproof glue 150 can extend to the gap d in communication with the through hole 142 through capillary action as long as the waterproof glue 150 is sufficient. However, moisture enters the flexible display device 100 from outside. Therefore, in fact, as long as the through hole 142 is filled with the waterproof glue 150, a beginning of entering the flexible display device for moisture can be closed, such that moisture cannot enter the gap d below the first protection sheet 140.

In this embodiment, the TFT array substrate 110 includes a flexible substrate 116 and a thin-film transistor (TFT) layer 118. The TFT layer 118 is located on the flexible substrate 116. The flexible substrate 116 may be made of a material including polyimide (PI), but the present invention is not limited in this regard. The front panel laminate 130 includes a light-transmissive film 132 and a display medium layer 134. The display medium layer 134 is located between the light-transmissive film 132 and the TFT array substrate 110. In one embodiment, the display medium layer 134 may include plural microcapsules that have plural charged particles therein, such as black particles and white particles. In another embodiment, the display medium layer 134 may be made of organic light-emitting diode materials.

In addition, the flexible display device 100 further includes a supporting plate 170 and a second protection sheet 180. The TFT array substrate 110 is located on the supporting plate 170. The second protection sheet 180 covers the second surface 114 of the TFT array substrate 110 facing away from the first surface 112. In this embodiment, the first protection sheet 140 and the second protection sheet 180 may be a hot melt protective sheet (HMPS), but the present invention is not limited in this regard.

It is to be noted that the connection relationship and materials of the aforementioned elements will not be repeated. In the following description, other cross-sectional structures of the flexible display device 100 will be described.

FIG. 3 is a cross-sectional view of the flexible display device 100 taken along line 3-3 shown in FIG. 1. As shown in FIG. 1 and FIG. 3, a height difference is formed between an edge of the front panel laminate 130 and the first surface 112 of the TFT array substrate 110, and thus the gap d below the first protection sheet 140 may extend from the flexible printed circuit board 120 to the front panel laminate 130. In this embodiment, the gap d in communication with the through hole 142 is among a lateral surface 136 of the front panel laminate 130, the first protection sheet 140, the TFT array substrate 110, and the flexible printed circuit board 120, and the waterproof glue 150 may extend from the through hole 142 to the gap d by capillary action so as to abut the lateral surface 136 of the front panel laminate 130, thereby ensuring moisture cannot move to the front panel laminate 130 through the through hole 142 and the gap d.

Figure 4:
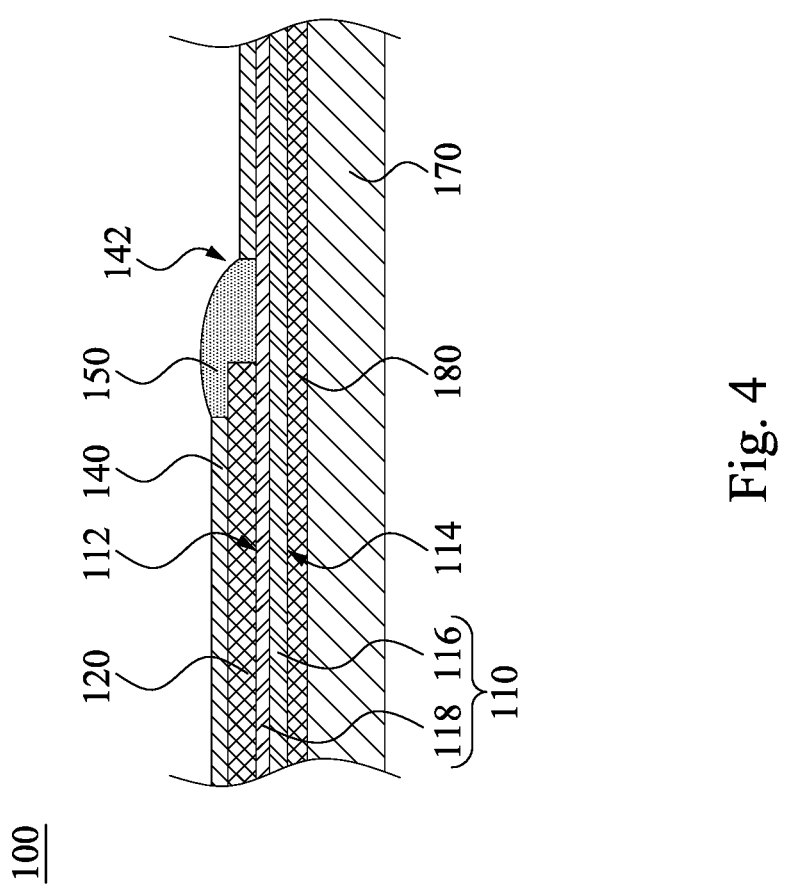
FIG. 4 is a cross-sectional view of the flexible display device taken along line 4-4 shown in FIG. 1.

FIG. 4 is a cross-sectional view of the flexible display device 100 taken along line 4-4 shown in FIG. 1. As shown in FIG. 1 and FIG. 4, a portion of the first protection sheet 140 is located on the flexible printed circuit board 120, and another portion of the first protection sheet 140 is located on the TFT array substrate 110. The waterproof glue 150 is located in the through hole 142 of the first protection sheet 140, and covers the flexible printed circuit board 120 and the TFT array substrate 110 in the through hole 142. Since the waterproof glue 150 is in a liquid phase before solidification and the first protection sheet 140 is flexible, the waterproof glue 150 filling in the through hole 142 of the first protection sheet 140 may solve the problem about a height difference between the TFT array substrate 110 and the flexible printed circuit board 120. Therefore, the flexible printed circuit board 120 may be selected in an adjustable manner. For example, a thicker flexible printed circuit board 120 may be used in the flexible display device 100.

Figure 5:
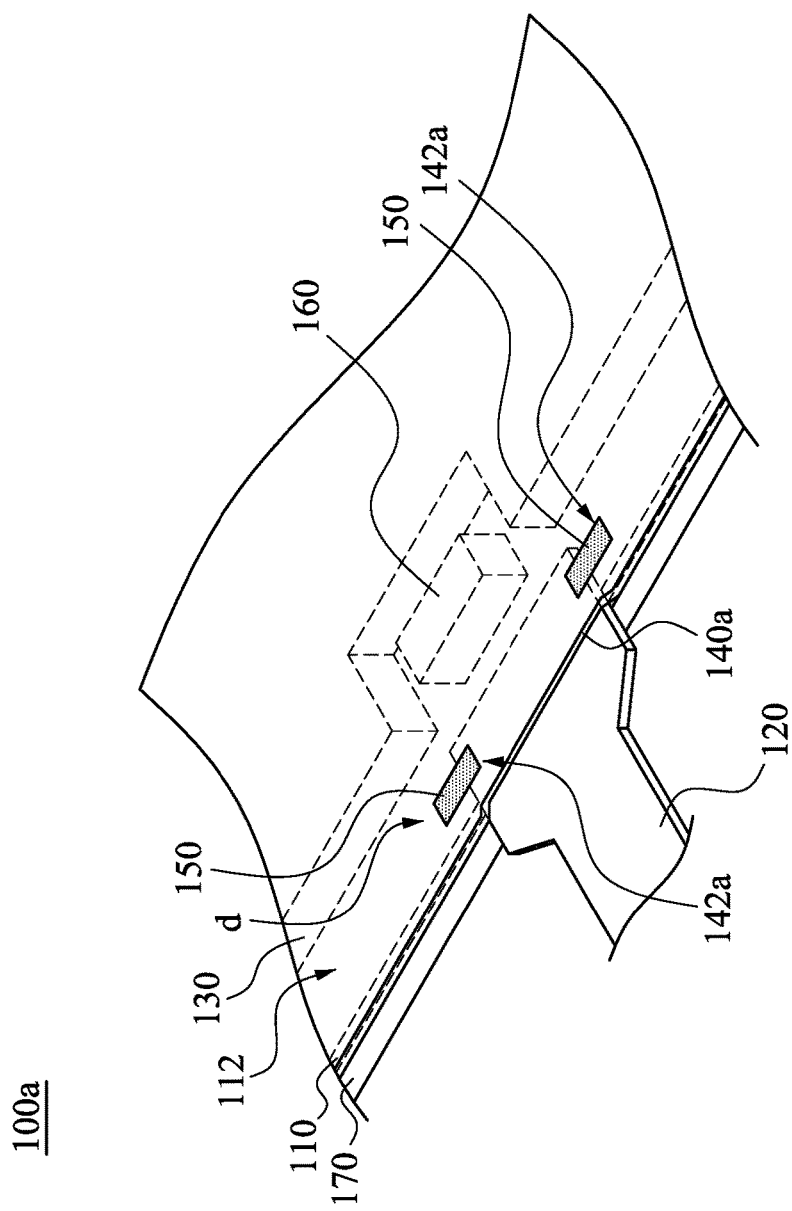
FIG. 5 is a partially perspective view of a flexible display device according to one embodiment of the present invention.

FIG. 5 is a partially perspective view of a flexible display device 100a according to one embodiment of the present invention. The flexible display device 100a includes the TFT array substrate 110, the flexible printed circuit board 120, the front panel laminate 130, a first protection sheet 140a, and the waterproof glue 150. The difference between this embodiment and the embodiment shown in FIG. 1 is that the shape of a through hole 142a of the first protection sheet 140a is a rectangle or a square. The waterproof glue 150 in the through hole 142a may close a beginning of entering the flexible display device 100a for moisture, such that moisture does not easily affect the front panel laminate 130 to cause non-uniform brightness in the flexible display device 100a.

Figure 6:
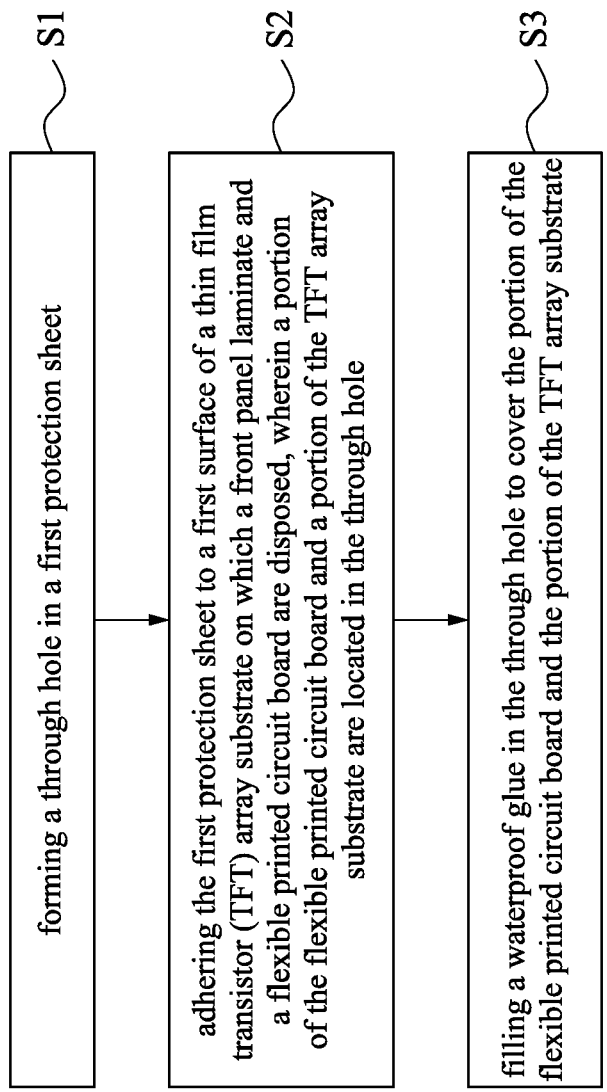
FIG. 6 is a flow chart of a manufacturing method of a flexible display device according to one embodiment of the present invention.

FIG. 6 is a flow chart of a manufacturing method of a flexible display device according to one embodiment of the present invention. In step S1, a through hole is formed in a first protection sheet. Next, in step S2, the first protection sheet is adhered to a first surface of a thin-film transistor (TFT) array substrate on which a front panel laminate and a flexible printed circuit board are disposed, wherein a portion of the flexible printed circuit board and a portion of the TFT array substrate are located in the through hole. Thereafter, in step S3, a waterproof glue fills in the through hole to cover the portion of the flexible printed circuit board and the portion of the TFT array substrate.

Figure 7:
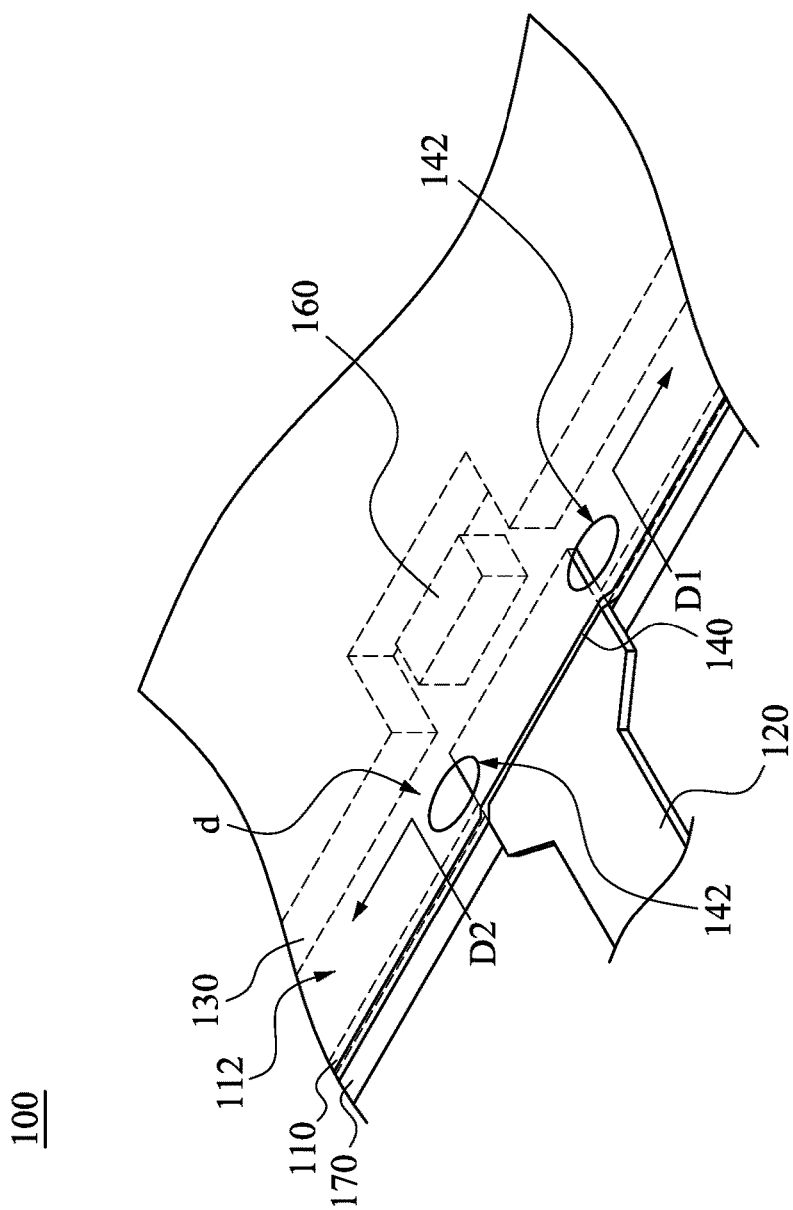
FIG. 7 is a partially perspective view of the flexible display device shown in FIG. 1 before filling a waterproof glue.

FIG. 7 is a partially perspective view of the flexible display device 100 shown in FIG. 1 before filling the waterproof glue 150. In manufacturing the flexible display device 100, the flexible printed circuit board 120, the front panel laminate 130, and the integrated circuit 160 may be disposed on the first surface 112 of the TFT array substrate 110. Thereafter, the first protection sheet 140 and the second protection sheet 180 are provided, and the through hole 142 is formed in the first protection sheet 140 (step S1). After the formation of the through hole 142, the first protection sheet 140 and the second protection sheet 180 may be respectively adhered to the first surface 112 and the second surface 114 of the thin TFT array substrate 110, such that the flexible printed circuit board 120, the front panel laminate 130, and the integrated circuit 160 are covered by the first protection sheet 140, and a portion of the flexible printed circuit board 120 and a portion of the TFT array substrate 110 are located in the through hole 142 of the first protection sheet 140 so as to be exposed (step S2), as shown in FIG. 7.

As shown in FIG. 1 and FIG. 7, before the waterproof glue 150 fills in the through hole 142 of the first protection sheet 140, moisture outside the flexible display device 100 may enter the gap d below the first protection sheet 140 through the through hole 142 or an edge of the first protection sheet 140 adjacent to the flexible printed circuit board 120, and may diffuse to the front panel laminate 130 along directions D1 and D2. The directions D1 and D2 may be referred to as paths of moisture. Since the gap d is formed by height differences between an edge of the flexible printed circuit board 120 and the TFT array substrate 110 and between an edge of the front panel laminate 130 and the TFT array substrate 110, the directions D1 and D2 may be referred to as a lengthwise direction of the gap d. After the waterproof glue 150 fills in the through hole 142 of the first protection sheet 140 (step S3), the waterproof glue 150 may cover the flexible printed circuit board 120 and the TFT array substrate 110 in the through hole 142 to close a beginning of entering the flexible display device 100 for moisture. Moreover, the waterproof glue 150 may extend to the gap d in communication with the through hole 142 through capillary action.

Figure 8:
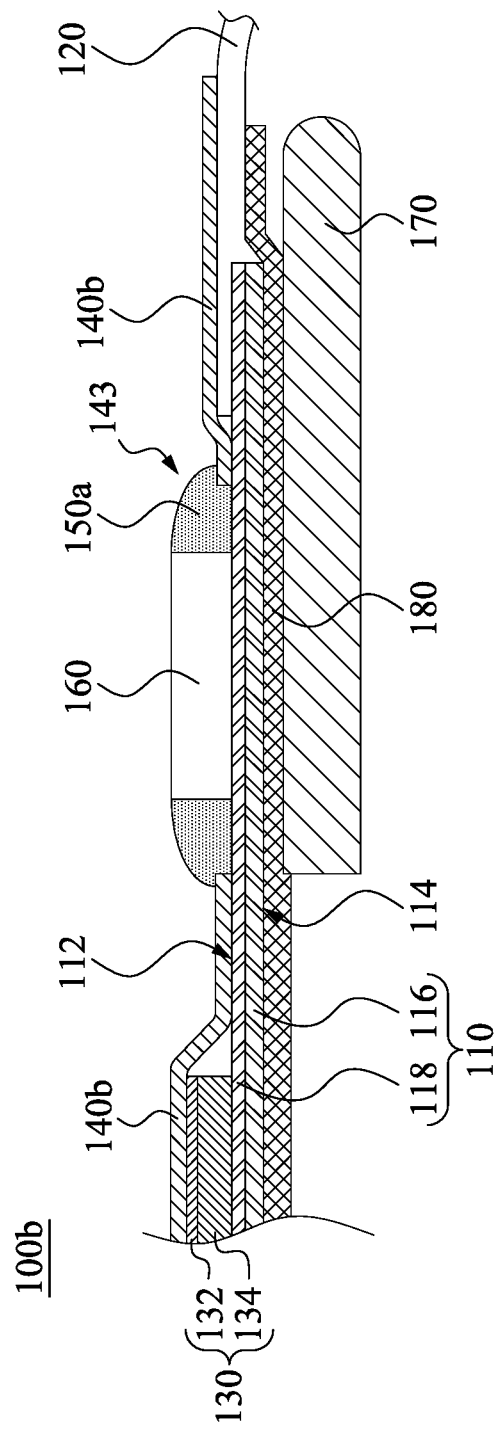
FIG. 8 is a cross-sectional view of a flexible display device according to one embodiment of the present invention.

FIG. 8 is a cross-sectional view of a flexible display device 100b according to one embodiment of the present invention. The flexible display device 100b includes the TFT array substrate 110, the integrated circuit (IC) 160, the front panel laminate 130, a first protection sheet 140b, and a waterproof glue 150a. The integrated circuit 160 and the front panel laminate 130 are located on the first surface 112 of the TFT array substrate 110. In this embodiment, the first protection sheet 140b covers the front panel laminate 130 and the first surface 112 of the TFT array substrate 110, and has an opening 143. The integrated circuit 160 is in the opening 143 of the first protection sheet 140b, such that the integrated circuit 160 is exposed through the opening 143. The waterproof glue 150a is located in the opening 143 of the first protection sheet 140b, and surrounds the integrated circuit 160. Moreover, in this embodiment, the waterproof glue 150a may fill in the opening 143 of the first protection sheet 140b. The waterproof glue 150a extends over a portion of the first protection sheet 140b. As shown in FIG. 8, a portion of the waterproof glue 150a is located on a top surface of the first protection sheet 140b. As a result, the waterproof glue 150a can prevent damages near the integrated circuit 160.

The first protection sheet 140b may be a hot melt protective sheet (HMPS). The waterproof glue 150a may be IC packaging adhesive, and the waterproof glue 150a is thermal curable. For example, the waterproof glue 150a may be solidified in about 80° C. Moreover, the flexible display device 100b may further include the second protection sheet 180. The second protection sheet 180 covers the second surface 114 of the TFT array substrate 110.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims.

What is claimed is:

1. A flexible display device, comprising:
   a thin-film transistor (TFT) array substrate having a first surface;
   a flexible printed circuit board disposed on an edge of the first surface, and extending outward from the edge of the first surface;
   a front panel laminate located on the first surface of the TFT array substrate;
   a first protection sheet covering the front panel laminate, the first surface of the TFT array substrate, and the flexible printed circuit board on the first surface, and having a through hole, wherein a portion of the flexible printed circuit board and a portion of the TFT array substrate are located in the through hole; and
   a waterproof glue located in the through hole and covering the portion of the flexible printed circuit board and the portion of the TFT array substrate.

2. The flexible display device of claim 1, wherein the waterproof glue abuts the first surface of the TFT array substrate, the flexible printed circuit board, and the first protection sheet.

3. The flexible display device of claim 1, wherein a gap is among a lateral surface of the front panel laminate, the first protection sheet, the TFT array substrate, and the flexible printed circuit board, and is in communication with the through hole, and the waterproof glue extends to the gap.

4. The flexible display device of claim 3, wherein the waterproof glue abuts the lateral surface of the front panel laminate.

5. The flexible display device of claim 1, wherein the waterproof glue protrudes from through hole of the first protection sheet.

6. The flexible display device of claim 1, further comprising:
   an integrated circuit located on the first surface of the TFT array substrate, and located between the front panel laminate and the flexible printed circuit board.

7. The flexible display device of claim 1, further comprising:
   a supporting plate, wherein the TFT array substrate is located on the supporting plate.

8. The flexible display device of claim 1, wherein the TFT array substrate has a second surface opposite the first surface, and the flexible display device further comprises:
   a second protection sheet covering the second surface of the TFT array substrate.

9. The flexible display device of claim 8, wherein the second protection sheet is a hot melt protective sheet (HMPS).

10. The flexible display device of claim 1, wherein the first protection sheet is a hot melt protective sheet.

11. The flexible display device of claim 1, wherein the TFT array substrate comprises:
    a flexible substrate; and
    a thin-film transistor (TFT) layer located on the flexible substrate.

12. The flexible display device of claim 1, wherein the front panel laminate is an electro-phoretic display panel or an organic light-emitting diode (OLED) panel.

13. The flexible display device of claim 1, wherein the front panel laminate comprises:
    a light-transmissive film; and
    a display medium layer located between the light-transmissive film and the TFT array substrate.

14. A flexible display device, comprising:
- a thin-film transistor (TFT) array substrate having a first surface;
- an integrated circuit located on the first surface of the TFT array substrate;
- a front panel laminate located on the first surface of the TFT array substrate;
- a first protection sheet covering the front panel laminate and the first surface of the TFT array substrate, and having an opening, wherein the integrated circuit is in the opening; and
- a waterproof glue located in the opening and surrounding the integrated circuit.

15. The flexible display device of claim 14, wherein the waterproof glue extends over a portion of the first protection sheet.

16. The flexible display device of claim 14, wherein the first protection sheet is a hot melt protective sheet (HMPS).

17. The flexible display device of claim 14, wherein the TFT array substrate has a second surface opposite the first surface, and the flexible display device further comprises:
- a second protection sheet covering the second surface of the TFT array substrate.

18. A manufacturing method of a flexible display device, comprising:
- forming a through hole in a first protection sheet;
- adhering the first protection sheet to a first surface of a thin-film transistor (TFT) array substrate on which a front panel laminate and a flexible printed circuit board are disposed, wherein a portion of the flexible printed circuit board and a portion of the TFT array substrate are located in the through hole; and
- filling a waterproof glue in the through hole to cover the portion of the flexible printed circuit board and the portion of the TFT array substrate.

19. The manufacturing method of the flexible display device of claim 18, wherein the filling of the waterproof glue comprises:
- extending the waterproof glue to a gap in communication with the through hole through capillary action, wherein the gap is among a lateral surface of the front panel laminate, the first protection sheet, the TFT array substrate, and the flexible printed circuit board.

20. The manufacturing method of the flexible display device of claim 18, further comprising:
- adhering a second protection sheet to a second surface of the TFT array substrate, wherein the second surface is opposite the first surface.

* * * * *